(12) United States Patent
Sundström et al.

(10) Patent No.: US 9,112,450 B2
(45) Date of Patent: Aug. 18, 2015

(54) FREQUENCY TRANSLATION FILTER APPARATUS AND METHOD

(75) Inventors: Lars Sundström, Södra Sandby (SE); Sven Mattisson, Bjärred (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 87 days.

(21) Appl. No.: 13/983,079

(22) PCT Filed: Feb. 8, 2012

(86) PCT No.: PCT/EP2012/052101
§ 371 (c)(1),
(2), (4) Date: Sep. 16, 2013

(87) PCT Pub. No.: WO2012/107471
PCT Pub. Date: Aug. 16, 2012

(65) Prior Publication Data
US 2014/0030997 A1    Jan. 30, 2014

Related U.S. Application Data

(60) Provisional application No. 61/445,128, filed on Feb. 22, 2011.

(30) Foreign Application Priority Data

Feb. 11, 2011 (EP) .................................. 11154194

(51) Int. Cl.
*H04B 1/16* (2006.01)
*H03D 7/16* (2006.01)

(52) U.S. Cl.
CPC . *H03D 7/16* (2013.01); *H03D 7/166* (2013.01)

(58) Field of Classification Search
USPC .......... 455/550.1, 575.1, 150.1, 180.1, 182.1, 455/296, 307, 323, 326
See application file for complete search history.

(56) References Cited

U.S. PATENT DOCUMENTS

| 5,696,437 | A  | 12/1997 | Panther et al. |
| 7,541,863 | B2 | 6/2009  | Vilhonen       |
| 2006/0194559 | A1 | 8/2006  | Hyogo et al. |
| 2006/0199562 | A1 | 9/2006  | Taylor         |
| 2006/0208791 | A1 | 9/2006  | Vilhonen       |

(Continued)

FOREIGN PATENT DOCUMENTS

| EP | 0690568 A1     | 1/1996  |
| GB | 2423427 A      | 8/2006  |
| WO | 2009123583 A1  | 10/2009 |

*Primary Examiner* — Thanh Le
(74) *Attorney, Agent, or Firm* — Murphy, Bilak & Homiller, PLLC

(57) ABSTRACT

A frequency translation filter 500 is configured to receive a radio frequency (RF) signal 501 comprising first and second non-contiguous carriers or non-contiguous frequency ranges. The frequency translation filter comprises a mixer 503 configured to mix the RF signal 501 received on a first input with a local oscillator (LO) signal 505 received on a second input. A filter 507 comprises a frequency dependent load impedance, the filter having band-pass characteristics which, when frequency translated using the mixer 503, contain first and second pass-bands corresponding to the first and second non-contiguous carriers or non-contiguous frequency ranges. The first and second pass-bands are centered about the local oscillator frequency.

15 Claims, 16 Drawing Sheets

(56) References Cited

U.S. PATENT DOCUMENTS

| | | |
|---|---|---|
| 2007/0087710 A1 | 4/2007 | Chou et al. |
| 2009/0003101 A1 | 1/2009 | Yun et al. |
| 2009/0011732 A1* | 1/2009 | Bayruns ............... 455/150.1 |
| 2009/0088122 A1 | 4/2009 | Xu et al. |
| 2009/0176467 A1* | 7/2009 | Im et al. ............... 455/182.1 |
| 2010/0029323 A1* | 2/2010 | Tasic et al. ............ 455/550.1 |
| 2010/0267354 A1 | 10/2010 | Mirzaei et al. |
| 2011/0003572 A1* | 1/2011 | Mirzaei et al. .......... 455/307 |

* cited by examiner

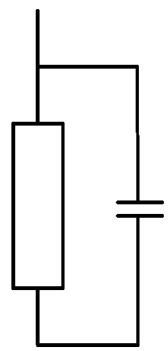
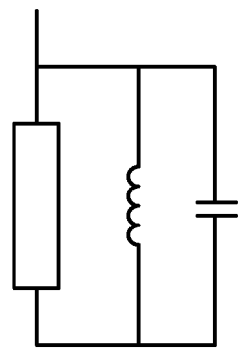
Figure 9a    Figure 9b
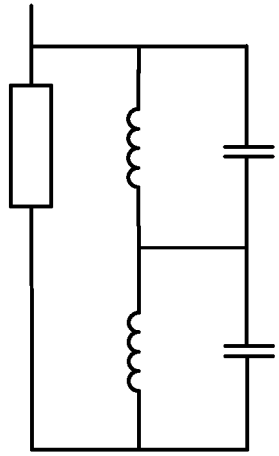
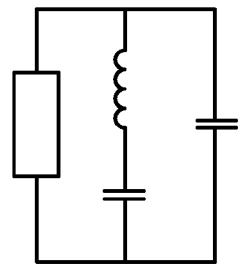
Figure 9c    Figure 9d
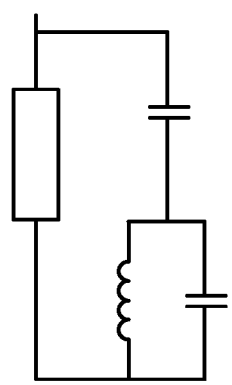
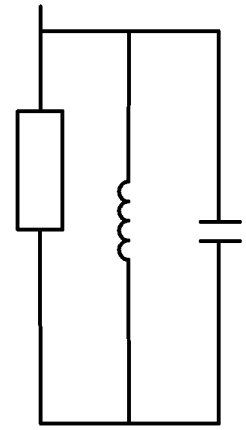
Figure 9e    Figure 9f

FREQUENCY TRANSLATION FILTER APPARATUS AND METHOD

TECHNICAL FIELD

The invention relates to a frequency translation filter apparatus and method, and in particular to a frequency translation filter apparatus and method for handling carrier aggregation in a radio receiver.

BACKGROUND

Radio frequency receivers have traditionally used filters such as Surface Acoustic Wave (SAW) or Bulk Acoustic Wave (BAW) filters. However, in order to reduce the component size and power consumption of filters used in such radio receivers, and to make such filters more compatible with integrated processing techniques such as CMOS fabrication, frequency translation filter techniques have been developed.

FIG. 1 shows the basic structure of a frequency translation filter. A passive mixer 101 comprising switching elements $101_a$ to $101_d$ is used to frequency translate a frequency dependent impedance in the form of a capacitor 103. The operation of the mixer 101 may be viewed as alternating the polarity of the capacitance 103 using a local oscillator (LO) signal to control the switching elements $101_a$ to $101_d$, the LO signal having a frequency $f_{LO}$ and period $T_{LO}$.

In practice two frequency translation filters are required in a radio receiver, which operate with an in-phase (LOi) and a quadrature-phase (LOq) local oscillator signal respectively. Referring to FIG. 2, a first frequency translation filter comprises a passive mixer 201 comprising switching elements $201_a$ to $201_d$ which are used to frequency translate a frequency dependent impedance in the form of a capacitor 203. A second frequency translation filter comprises a passive mixer 205 comprising switching elements $205_a$ to $205_d$ which are used to frequency translate a frequency dependent impedance in the form of a capacitor 207. The LO signal has a 25% duty cycle such that only one of the frequency translation filters 201, 205 is active at a time.

As shown in FIGS. 3a and 3b, respectively, a frequency translation filter (FTF) may be used simply as a load to an amplifier 301 (i.e. a frequency dependent impedance $Z_{in}$ for the amplifier 301 in FIG. 3a), or as a combined mixer and filter with a baseband output $V_{out}$ (the combined unit 303 shown in FIG. 3b).

The frequency translation filter technique has been proven to be successful for improving the selectivity of a RF front-end in a radio receiver, by effectively giving a band-pass characteristic of the RF circuit.

Recent development of radio transmission schemes suggests the use of multiple simultaneous carriers, referred to as carrier aggregation in the 3GPP Long Term Evolution (LTE) standard. In the future these carriers do not necessarily have to be contiguous in frequency. Simultaneous transmission over several non-contiguous carriers has also been proposed as a possible scenario for white-space and cognitive radio application.

One method developed by the present applicant for handling multiple non-contiguous carriers at a radio receiver is to use complex IF based receivers where a single RF front-end is used to receive multiple desired carriers (as well as undesired signals) and where the desired signals are obtained by means of complex IF mixing or a combination of zero-IF and complex-IF techniques. FIG. 4 shows an example of one such complex configuration, whereby the RF LO frequency is set to a frequency in the middle of two carriers of interest and the IF LO frequency is set to half the distance between the centre frequencies of the two carriers. A complex mixer 401 is used in such an arrangement for handling the multiple carriers. The technique shown in FIG. 4 targets scenarios where the carriers of interest are close to each other compared to their centre frequencies.

As such, the circuit arrangement of FIG. 4 is complex, and a costly method of handling multiple received carriers with non-contiguous frequencies.

SUMMARY

It is an aim of embodiments of the present invention to provide a simplified frequency translation filter apparatus and method for handling carrier aggregation.

According to a first aspect of the present invention there is provided a frequency translation filter configured to receive a radio frequency signal comprising first and second non-contiguous carriers or non-contiguous frequency ranges. The frequency translation filter comprises a mixer configured to mix the radio frequency signal received on a first input with a local oscillator signal received on a second input; and a filter comprising a frequency dependent load impedance, the filter having band-pass characteristics which, when frequency translated by the mixer, contain first and second pass-bands corresponding to the first and second non-contiguous carriers or non-contiguous frequency ranges, wherein the first and second pass-bands are centered about the local oscillator frequency.

According to another aspect of the present invention there is provided a frequency translation filter configured to receive a radio frequency signal comprising first and second non-contiguous carriers or non-contiguous frequency ranges. The frequency translation filter comprises a mixer configured to mix the radio frequency signal received on a first input with a local oscillator signal received on a second input; and a composite band-pass or low-pass filter comprising a frequency dependent load impedance, the composite band-pass or low-pass filter comprising one or more stop-band or pass-band characteristics which, when frequency translated by the mixer, contain one or more stop-bands for suppressing signals other than the desired first and second non-contiguous carriers or non-contiguous frequency ranges.

According to another aspect of the present invention there is provided a method of obtaining first and second signals from a received radio frequency signal comprising first and second non-contiguous carriers or non-contiguous frequency ranges. The method comprises the steps of: mixing the received radio frequency signal with a local oscillator signal in order to frequency translate a filter comprising a frequency dependent load impedance, the filter having band-pass characteristics which, when frequency translated by the mixing step, contain first and second pass-bands corresponding to the first and second non-contiguous carriers or non-contiguous frequency ranges, wherein the first and second pass-bands are centered on the local oscillator frequency.

According to another aspect of the present invention there is provided a method of obtaining first and second signals from a received radio frequency signal comprising first and second non-contiguous carriers or non-contiguous frequency ranges. The method comprises the steps of: mixing the received radio frequency signal with a local oscillator signal in order to frequency translate a composite filter comprising a frequency dependent load impedance, the composite filter configured to comprise one or more band-stop or band-pass characteristics which, when frequency translated by the mixing step, contain one or more stop-bands for suppressing signals other than the desired first and second non-contiguous carriers or non-contiguous frequency ranges.

The embodiments described herein have the advantage of providing selectivity for two or more non-contiguous carriers or non-contiguous frequency ranges in the front-end of a radio frequency receiver.

BRIEF DESCRIPTION OF THE DRAWINGS

For a better understanding of the present invention, and to show more clearly how it may be carried into effect, reference will now be made, by way of example only, to the following drawings in which:

FIG. 5c shows an example of a frequency response characteristic of a frequency translation filter according to FIG. 5a;

FIG. 5d shows another example of a frequency response characteristic of a frequency translation filter according to FIG. 5a;

FIGS. 9a to 9f are further examples of baseband filter circuits;

DETAILED DESCRIPTION

The embodiments below will be described in relation to having first and second aggregated carriers in a received signal. It is noted, however, that the invention is intended to embrace any number of multiple carriers in a received signal. Furthermore, the invention may also be used for receiving multiple non-contiguous frequency ranges.

Figure 5A:
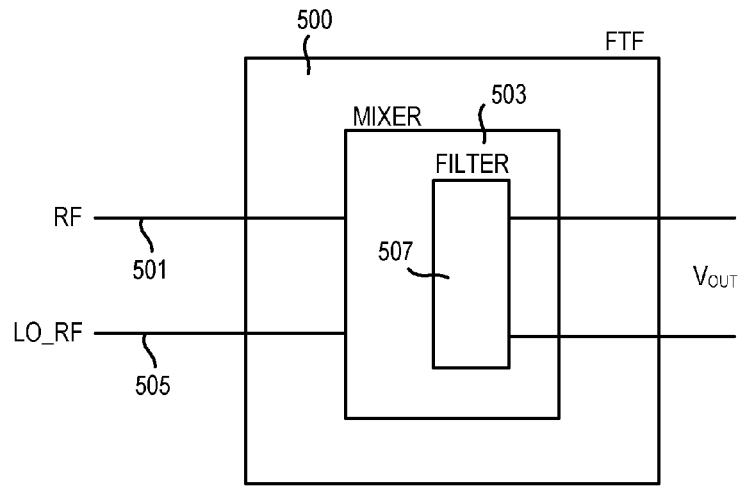
FIG. 5a shows a frequency translation filter according to an embodiment of the present invention.

FIG. 5a shows a frequency translation filter 500 according to an embodiment of the present invention. The frequency translation filter 500 is configured to receive a radio frequency (RF) signal 501 comprising first and second non-contiguous carriers or non-contiguous frequency ranges. The frequency translation filter comprises a mixer 503 (for example a passive mixer) configured to mix the RF signal 501 received on a first input with a local oscillator signal (LO_RF) 505 received on a second input. A filter 507 comprises a frequency dependent load impedance, whereby the filter 507 has band-pass characteristics which, when frequency translated using the mixer 503, contain first and second pass-bands corresponding to the first and second non-contiguous carriers or non-contiguous frequency ranges. The first and second pass-bands are centered about the local oscillator frequency.

According to one embodiment the filter 507 comprises a band-pass filter which is translated into two band-pass responses arranged symmetrically around the local oscillator frequency 505 of the mixer 503. For example, the absolute position of the pass-bands as seen from the RF side can be configured to be LO_RF+/−IF, where LO_RF is the local oscillator signal driving the mixer 503 and IF is centre frequency of the band-pass filter 507 when seen without the frequency translation. As such, a single resonance, in the case of a band-pass load, is frequency translated into two resonances centered around the local oscillator frequency, keeping the same distance to the local oscillator as the resonance frequency of the single resonance itself. As will be described in greater detail later in the application, the filter 507 may alternatively comprise a composite filter which is translated into a combination of band-pass and band-stop filters that suppresses unwanted signals, while passing at least the first and second non-contiguous carriers or non-contiguous frequency ranges.

The embodiment above has the advantage of providing a simplified frequency translation filter apparatus for handling carrier aggregation.

A further advantage of the arrangement described above is that if the local oscillator frequency changes, the two resonances will follow the local oscillator frequency by keeping their distance to the local oscillator frequency fixed.

Figure 5B:
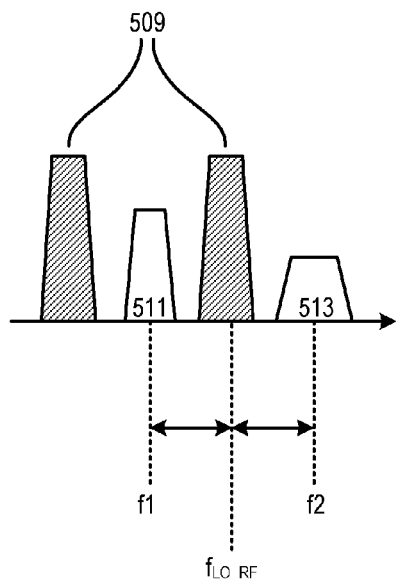
FIG. 5b shows an example of carrier signals received by a radio receiver.
Figure 5C:
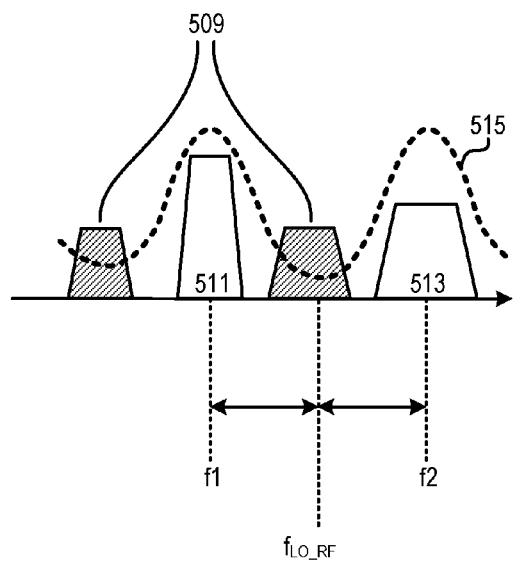

Referring to FIG. 5b, this shows an example of a received RF signal having first and second non-contiguous carriers or frequency ranges 511 and 513 which are desired to be received, and non-desired carriers or frequency ranges 509. In order to suppress the non-desired carrier signals, according to one embodiment the filter 507 of FIG. 5a is configured to have band-pass characteristics 515 as shown in FIG. 5c, which contain first and second pass-bands corresponding to the first and second non-contiguous carriers or non-contiguous frequency ranges 511 and 513 which are desired to be received. The local oscillator frequency $f_{LO\_RF}$ of the mixer is selected, for example, such that the first and second pass-bands are centered about the local oscillator frequency $f_{LO\_RF}$.

Figure 5D:
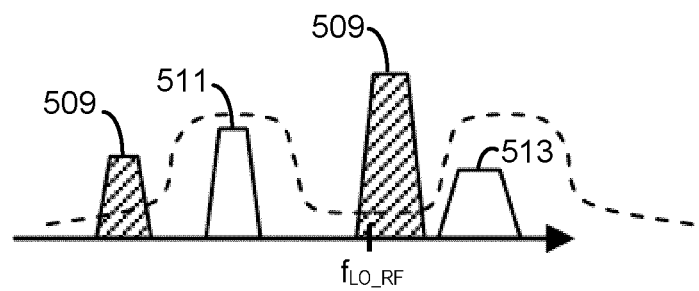

According to an alternative embodiment as shown in FIG. 5d, although the band-pass characteristics 515 is configured to be symmetrical about the local oscillator frequency $f_{LO\_RF}$, the desired signals are not symmetric with respect to the local oscillator frequency $f_{LO\_RF}$. This has the advantage of providing better suppression of undesired signals on one side of a carrier at the expense of lower suppression of signals at the other side. In such an embodiment the bandwidths of the pass-bands may be configured to be correspondingly larger such that the desired signals 511, 513 still fit within the respective pass-bands.

In other words, if the locations of the strong, undesired signals are known, the apparatus may be further configured such that the pass-bands are made wider and the local oscillator signal $f_{LO\_RF}$ shifted such that the suppression of strong undesired signals is optimized.

Although the embodiments shown in FIGS. 5a to 5d have been described in relation to using a filter having pass-bands, for example to pass specific first and second desired frequency carriers or frequency ranges, it will be appreciated that a filter having a composite response with pass-bands and stop-bands may also be used, for example to suppress undesired frequency carriers or frequency ranges, other than the first and second desired carriers or frequency ranges. In such an embodiment, a frequency translation filter 500 is configured to receive a radio frequency (RF) signal 501 comprising first and second non-contiguous carriers or non-contiguous frequency ranges, and comprises a mixer 503 configured to mix the RF signal 501 received on a first input with a local oscillator (LO) signal 505 received on a second input. The frequency translation filter 500 further comprises a composite filter having also stop-band or band-pass characteristics which, when frequency translated by the mixer, contain one or more stop-bands for suppressing signals other than the desired first and second non-contiguous carriers or non-contiguous frequency ranges.

As such, it is also possible to use other filter topologies like a band-stop filter combined with a band-pass filter, or low-pass filter which acts like a band-pass filter around the LO frequency when frequency translated, to block the translated band-stop frequencies, as opposed to the band-pass only case when frequencies outside the translated band-pass bandwidth are suppressed.

Figure 6:
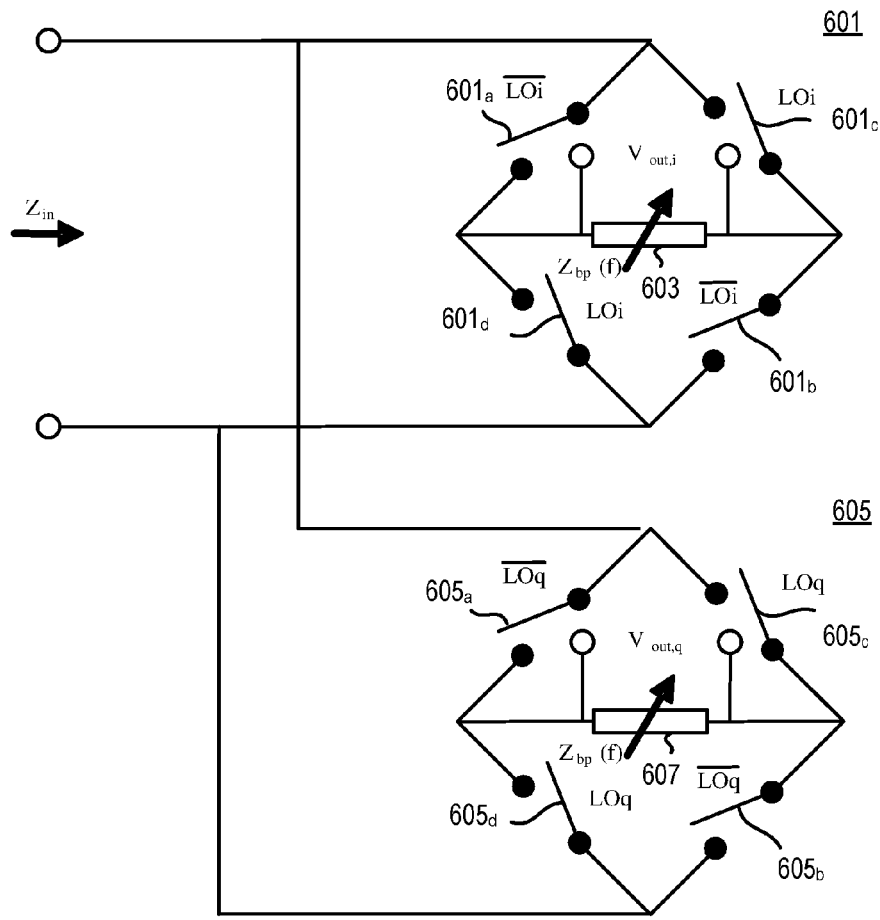
FIG. 6 shows further details of a frequency translation filter according to an embodiment of the present invention.
Figure 6:
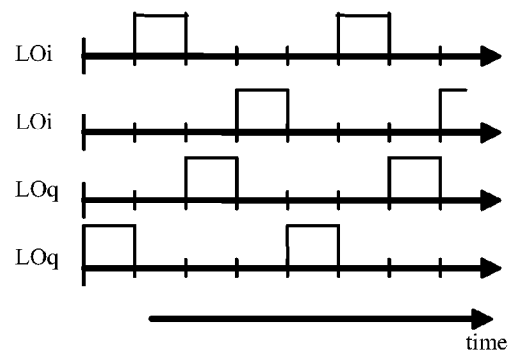

FIG. 6 shows an example of an implementation of a frequency translation filter in an embodiment using two frequency translation filters which operate with an in-phase (LOi) and a quadrature-phase (LOq) local oscillator signal respectively. A first frequency translation filter comprises a mixer 601 (for example a passive mixer) comprising switching elements 601$_a$ to 601$_d$ which are used to frequency translate a frequency dependent impedance 603 having a band-pass (or composite) characteristic as described above. A second frequency translation filter comprises a mixer 605 (for example a passive mixer) comprising switching elements 605$_a$ to 605$_d$ which are used to frequency translate a frequency dependent impedance 607 having a band-pass (or composite) characteristic as described above. The LO signal has a 25% duty cycle such that only one of the frequency translation filters 601, 605 is active at a time. One or each of the frequency dependant impedances 603, 607 having band-pass (or composite) characteristics are preferably controllable such that when the band-pass characteristic is frequency translated, the positioning and width of each of the first and second pass-bands can be controlled.

One or each of the frequency dependent load impedances 603, 607, i.e. the mixer load impedance, is preferably implemented as an integrated component, for example a passive component, but alternative implementations are also intended to be embraced by the invention. For example, gyrators, negative-impedance converters, frequency-dependent negative resistors or ladder structures are also possible, or any two or more of said impedances, may be used to implement a frequency dependent load impedance.

Furthermore, according to one embodiment, a frequency dependent load impedance 603 and/or 607 may itself also be implemented as another frequency translation filter using a different local oscillator frequency. According to such an embodiment, a first frequency dependent load impedance comprises a second frequency translation filter, the second frequency translation filter using a second local oscillator frequency. This arrangement can be continued for one or more further stages, for example whereby the second frequency translation filter comprises a second frequency dependent load impedance, wherein the second frequency dependent load impedance comprises a third frequency translation filter, the third frequency translation filter using a third local oscillator frequency, and so on.

As mentioned above, any of these load impedances may in turn consist of one or more impedances, for example connected in parallel, to form more complex impedances versus frequency characteristics, thus providing a composite response.

Figure 7:
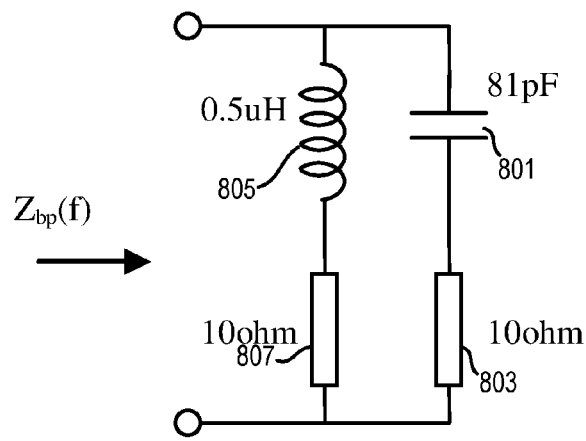
FIG. 7 shows an example of a filter circuit having a frequency dependent impedance, for use with embodiments of the present invention.

FIG. 7 shows an example of a band pass filter having a frequency dependent impedance $Z_{bp}(f)$, which may be implemented as a frequency dependent impedance 603, 607 of FIG. 6. The band pass filter comprises a capacitive element 801 connected in series with a first resistive element 803, these being connected in parallel with an inductive element 805 that is connected in series with a second resistive element 807. It is noted that the first resistive element 803 may model both a separate resistance and/or the losses in the capacitor 801 and inductor 805. Furthermore, it will be appreciated that the component values shown in FIG. 7 are examples only, and it is assumed that the switches of the mixer circuits are ideal, and that the local oscillator clock frequency is 1 GHz. It is noted that many other filter architectures may be used to provide a desired filter characteristic. Also, as mentioned above, components such as the inductor can be a "real" inductor or an emulated inductor (for example using gyrators and capacitors).

As mentioned above, the filter to be frequency-translated is preferably a tunable band-pass filter, such that the desired carriers or frequency ranges appear within the pass-bands. As such the centre frequencies of the first and second pass-bands, and the bandwidth of the first and second pass-bands, can be tuned. For example, the filter characteristics can be tuned by changing the values of one or more of the components shown in FIG. 7, for example changing the value of the inductive element 805. The filter characteristic may be tuned during set-up or manufacture to handle a particular set of desired aggregated carriers or frequency ranges. Furthermore, it is noted that the filter characteristics may be dynamically tuned during use. In such a dynamically tuned embodiment, carrier aggregation may be performed in systems, for example LTE, where there will be no fixed configurations of carriers as there are fixed cellular bands for example.

Figure 8:
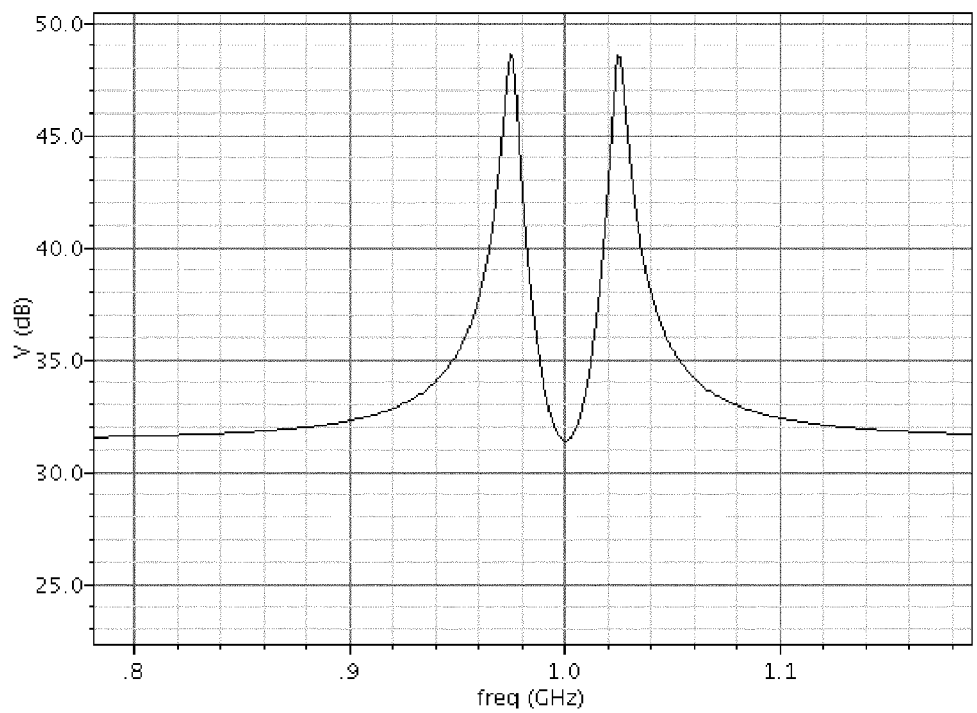
FIG. 8 illustrates a transfer function of the filter circuit shown in FIG. 7 after frequency translation.

FIG. 8 shows a transfer function for the frequency translation filter employing a load impedance as shown in the example of FIG. 7.

Different implementations of a composite filter may also be used. Furthermore, it is noted that an embodiment including a band-stop section may also be tuned in a similar manner to provide the desired characteristics, including in a dynamic manner.

FIGS. 9a to 9f show further examples of baseband filters that may be used, while FIGS. 10a to 10f show examples of baseband filter responses. FIG. 9a is an example of a low-pass filter, FIG. 9b a band-pass filter, FIG. 9c a double band-pass filter, FIG. 9d a composite low-pass and band-stop filter, FIG. 9e a composite low-pass and band-pass filter, and FIG. 9f a composite band-pass filter (similar to the band-pass filter of FIG. 9b, but whereby the slopes are more separated). FIG.

Figure 10A:
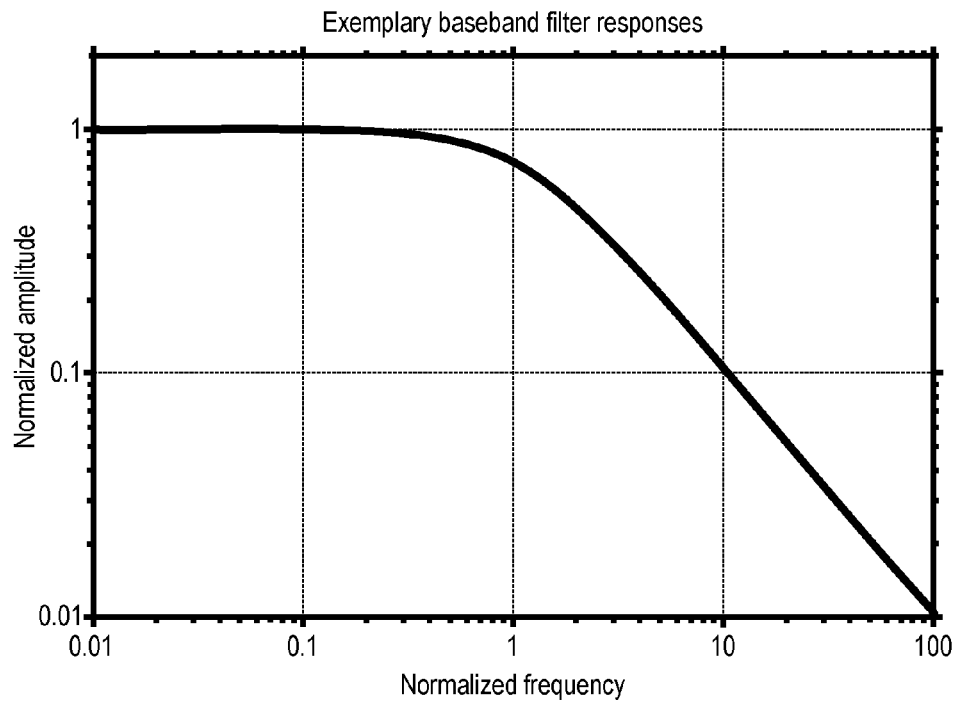
FIGS. 10a to 10f are examples of baseband filter responses.
Figure 10B:
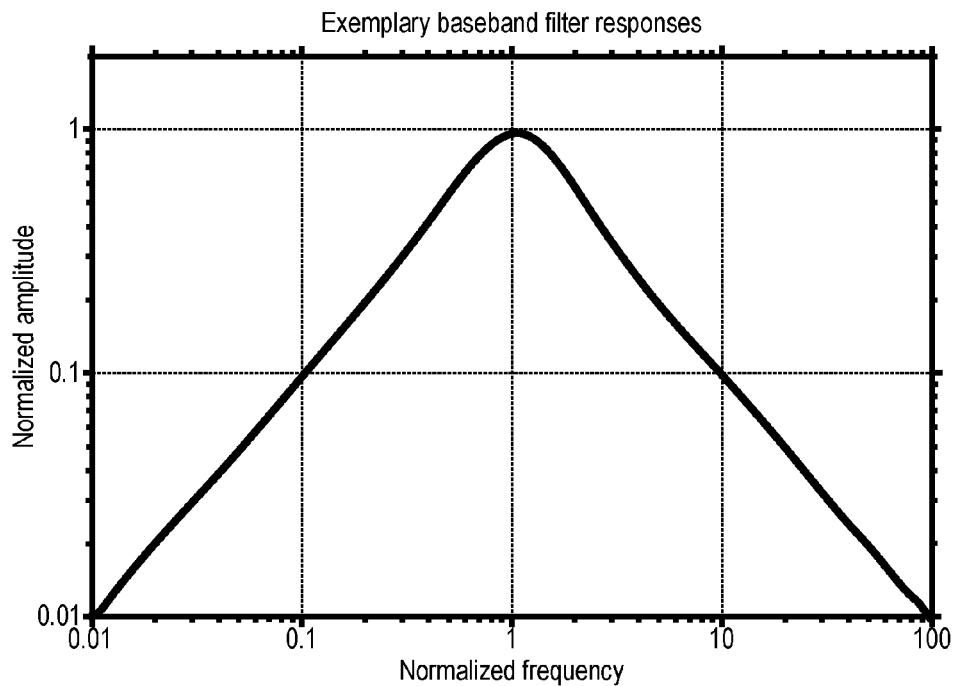
Figure 10C:
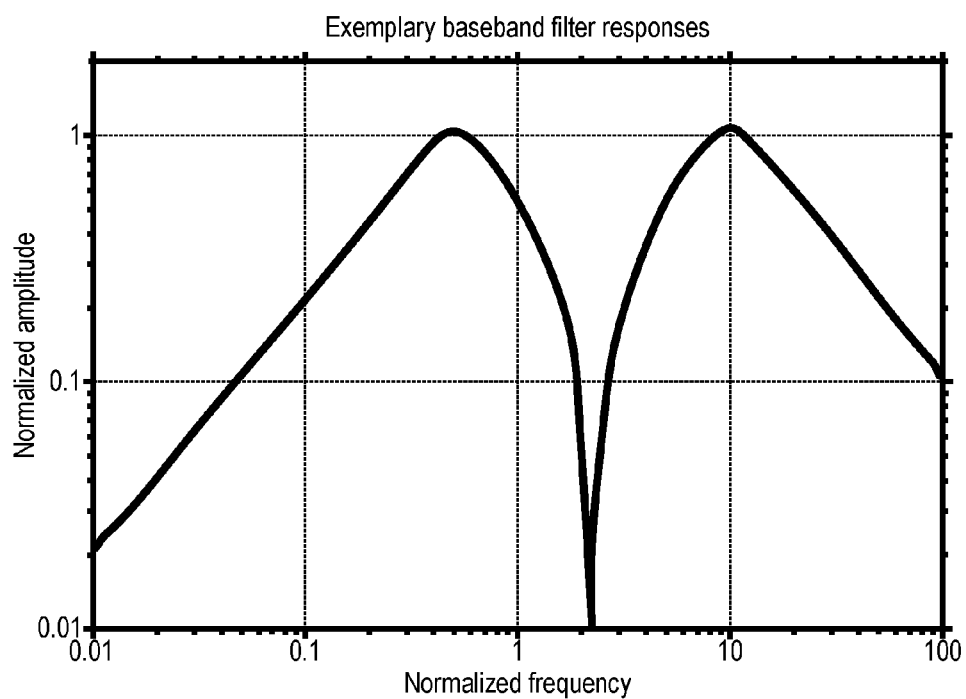
Figure 10D:
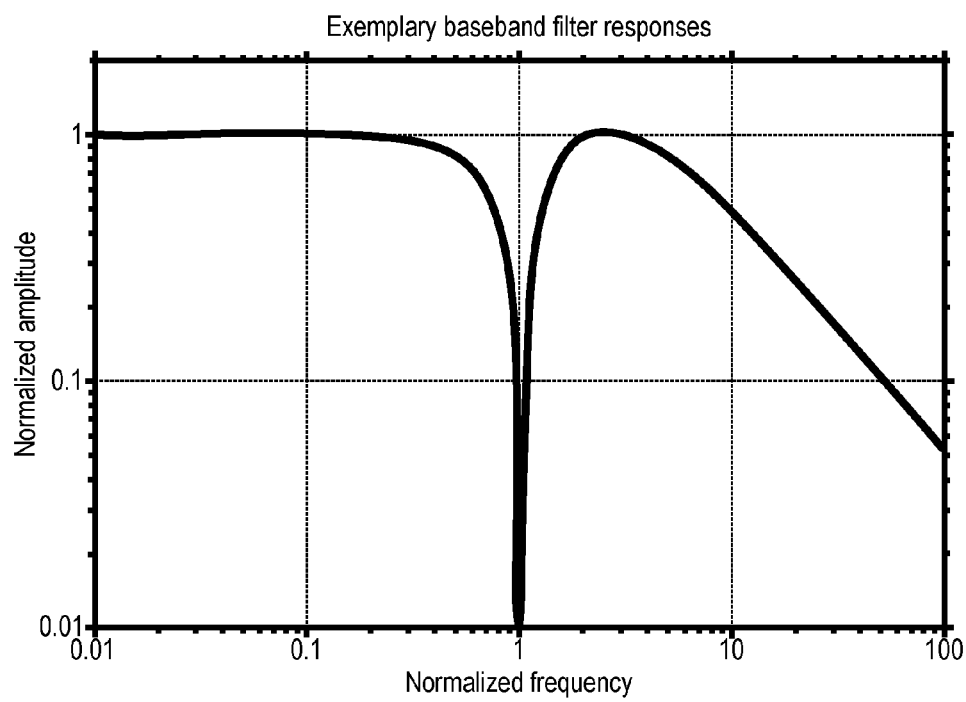
Figure 10E:
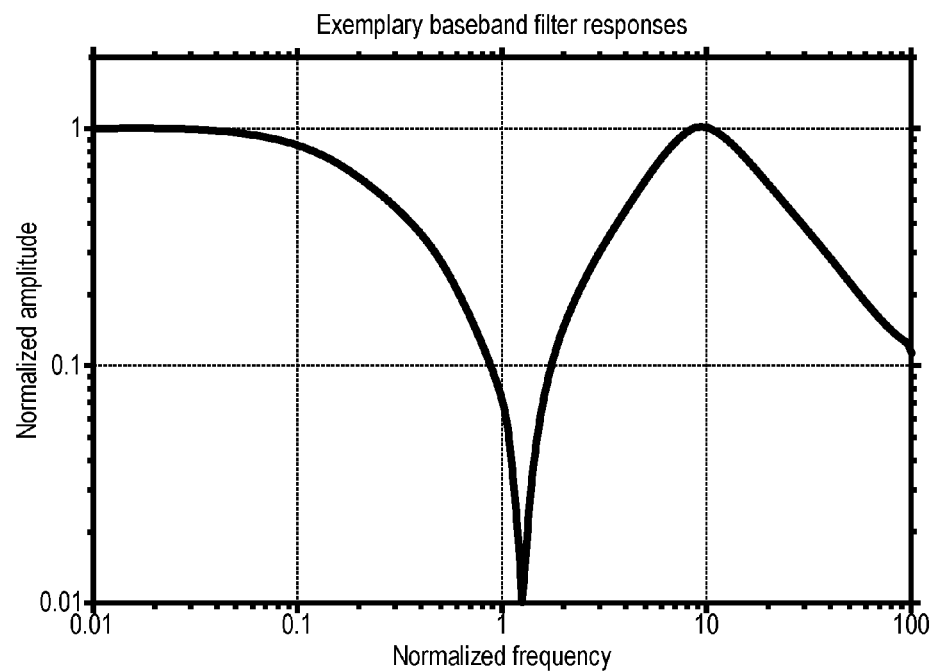
Figure 10F:
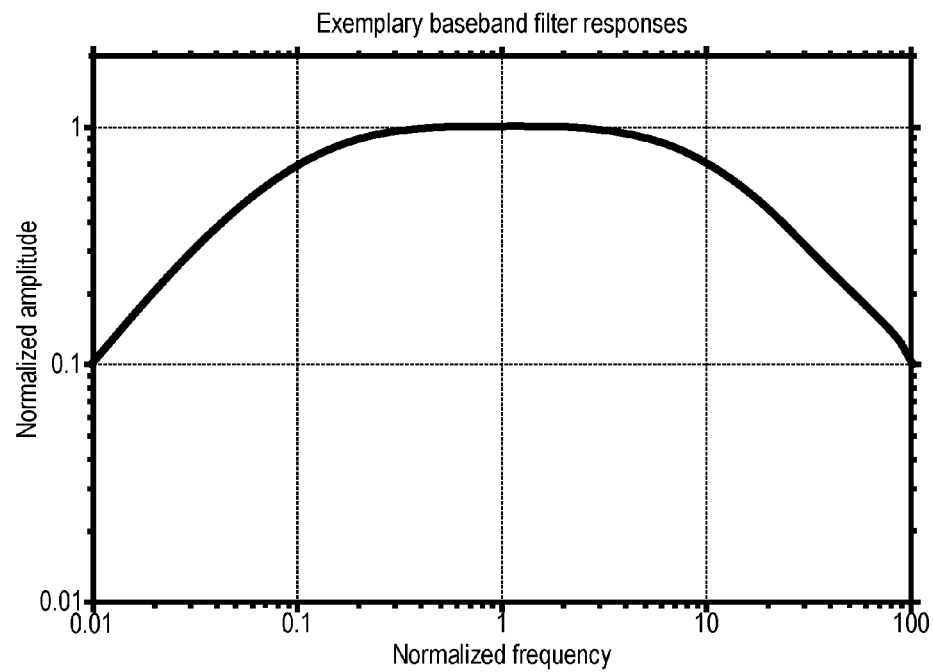

10a shows a baseband filter response for a low-pass filter, FIG. 10b a band-pass filter, FIG. 10c a double band-pass filter, FIG. 10d a composite low-pass and band-stop, FIG. 10e a composite low-pass and band-pass, and FIG. 10f a composite high-pass and low-pass. In the composite embodiments including a band-stop section, such a band-stop section can also include an inductor, or an emulated inductor, corresponding to a band-stop filter centered at zero frequency, to block frequencies around the mixer LO frequency. It is further noted that the translated band-stop frequency can be centered at one or more receiver mixer LO harmonics.

Figure 1:
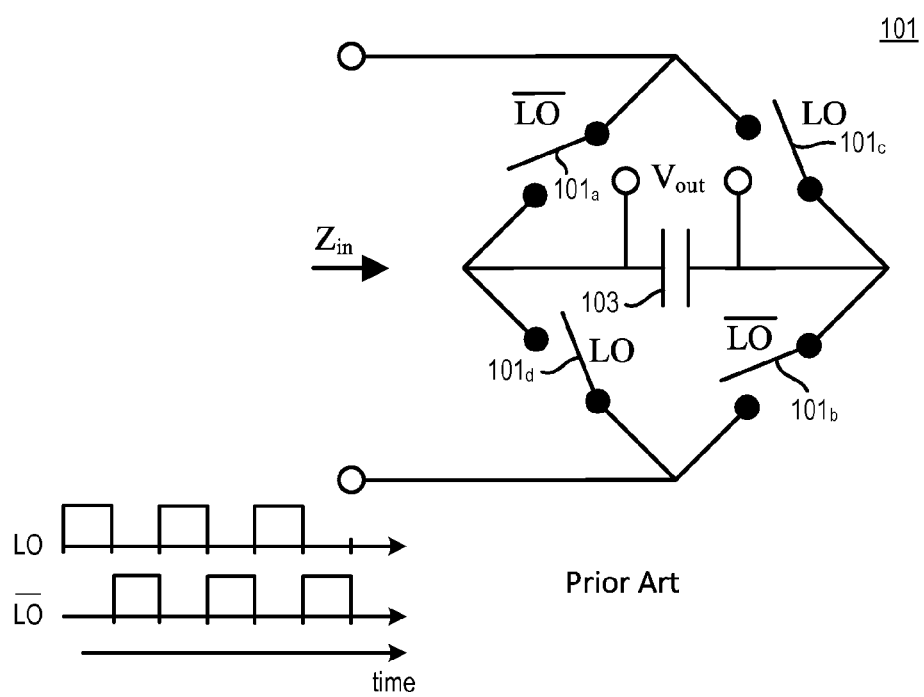
FIG. 1 shows a frequency translation filter according to the prior art.
Figure 2:
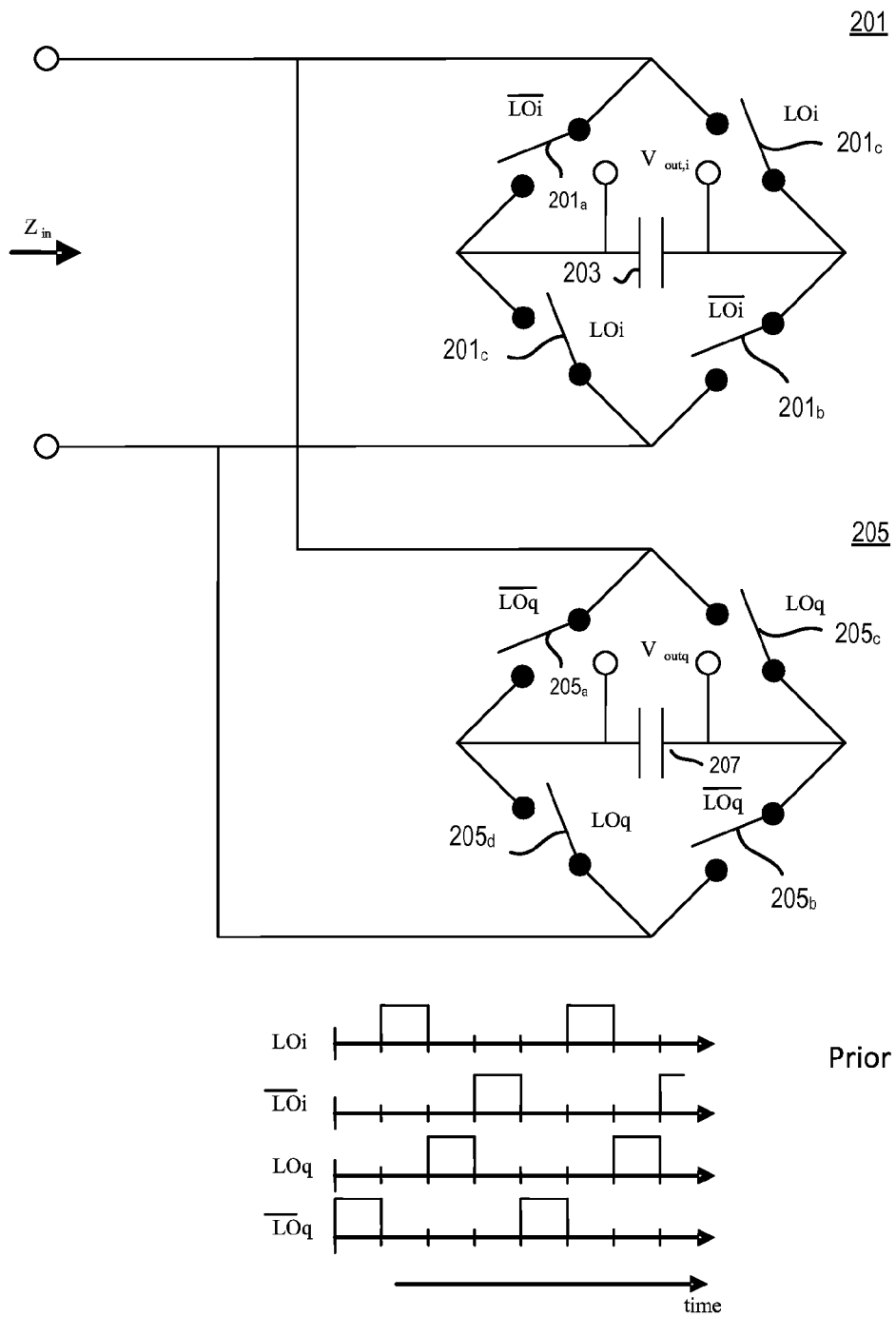
FIG. 2 shows an application that uses two frequency translation filters according to FIG. 1, in an application having In-phase and Quadrature-phase local oscillator signals.
Figure 3A:
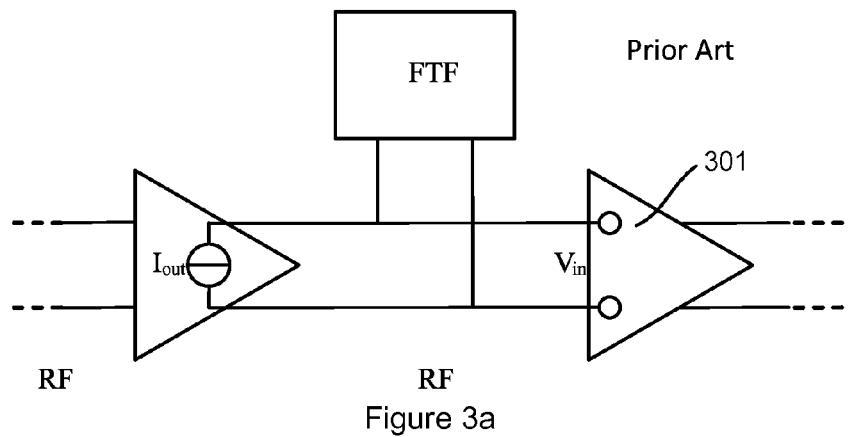
FIG. 3a shows how a frequency translation filter can be connected as a load to an amplifier circuit.
Figure 11:
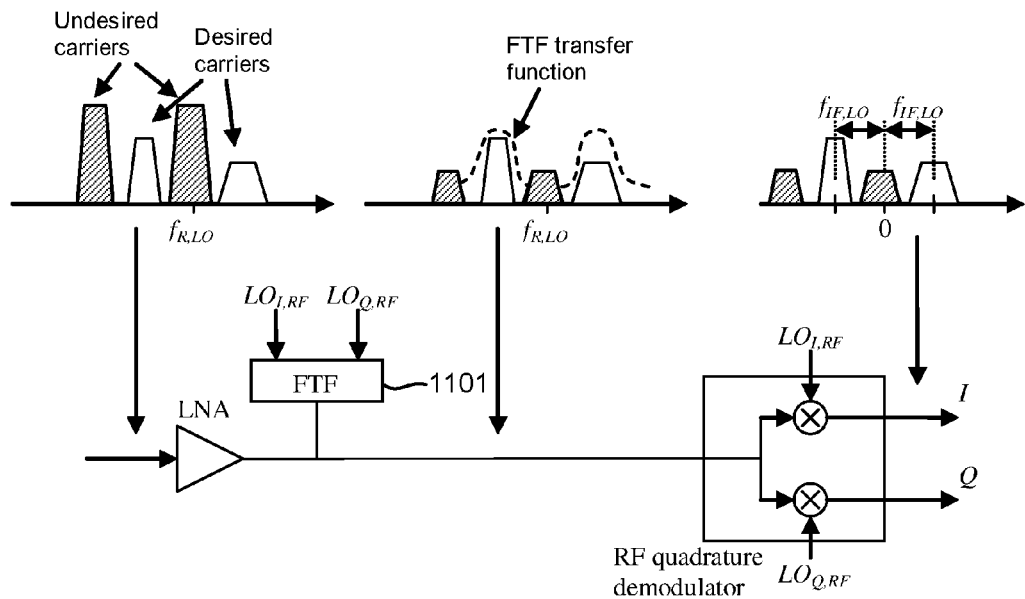
FIG. 11 shows an example of a frequency translation filter according to an embodiment of the invention when used as load for an amplifier.

Referring to FIG. 11, the frequency translation filters described in the embodiments above may be used as a load 1101 to an amplifier. For example, this may assume that the LNA output essentially has the nature of a current source (as shown in FIG. 3a). The characteristic of the load (i.e. FTF) is then reflected in the combined voltage gain of the LNA and FTF.

Figure 3B:
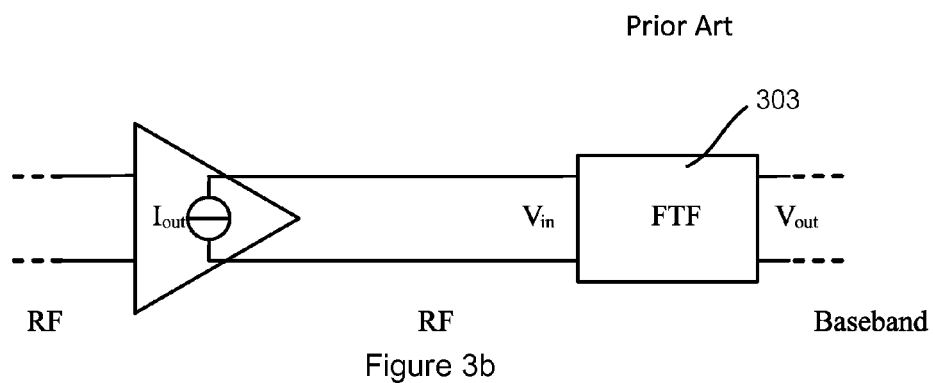
FIG. 3b shows a combined frequency translation filter and down conversion unit.
Figure 12:
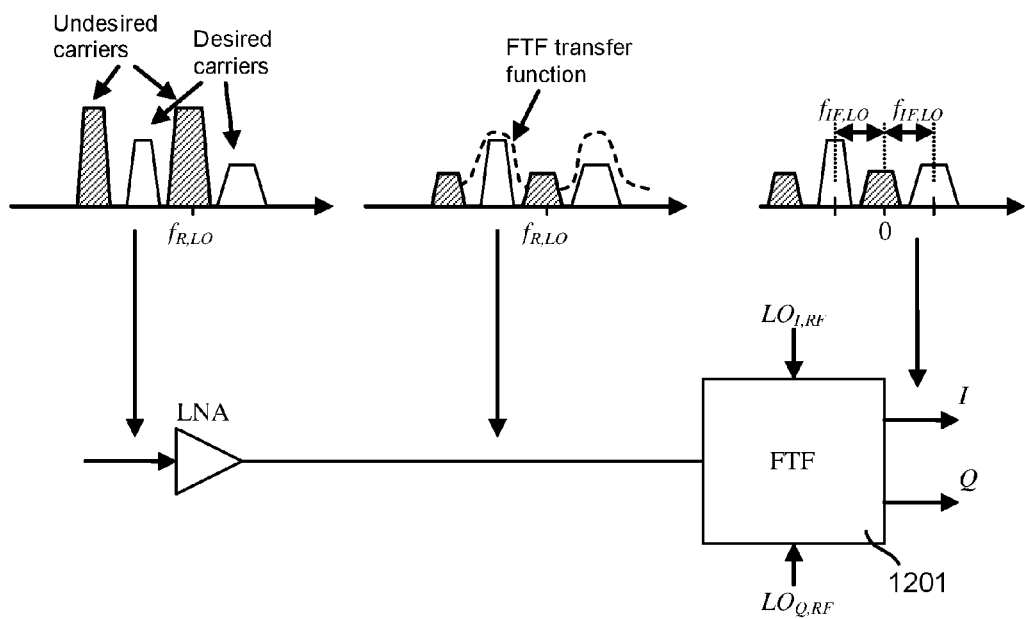
FIG. 12 shows an example of a frequency translation filter according to an embodiment of the invention when used as a combined frequency translation filter and down conversion unit.

Alternatively, referring to FIG. 12, the frequency translation filters described in the embodiments above may be used as a combined frequency translation filter and down conversion unit 1201. For example, the embodiments may be used in an arrangement as shown in FIG. 3b where the FTF (passive mixer and filter) doubles as a down-conversion mixer for the RF signal. The down-converted signal is tapped off from the filter. This can be seen from FIG. 6 that provides one port (Zin) when the FTF is used as load only. However, when used as combined FTF and down-conversion mixer the RF signal is inputted to the same port whereas the baseband components are available from $V_{outi}$, $V_{outq}$ ports.

It will therefore be appreciated that the embodiments described above use a common RF front-end for the reception of two or more non-contiguous carriers or non-contiguous frequency ranges, and use a frequency translation filter that effectively provides a double-pass-band response of the receiver with a response corresponding to the position and width of the desired carriers. This is obtained by frequency-translating a controllable band-pass filter.

The embodiments of the invention therefore provide selectivity for two non-contiguous carriers or frequency ranges in the RF front-end.

Figure 4:
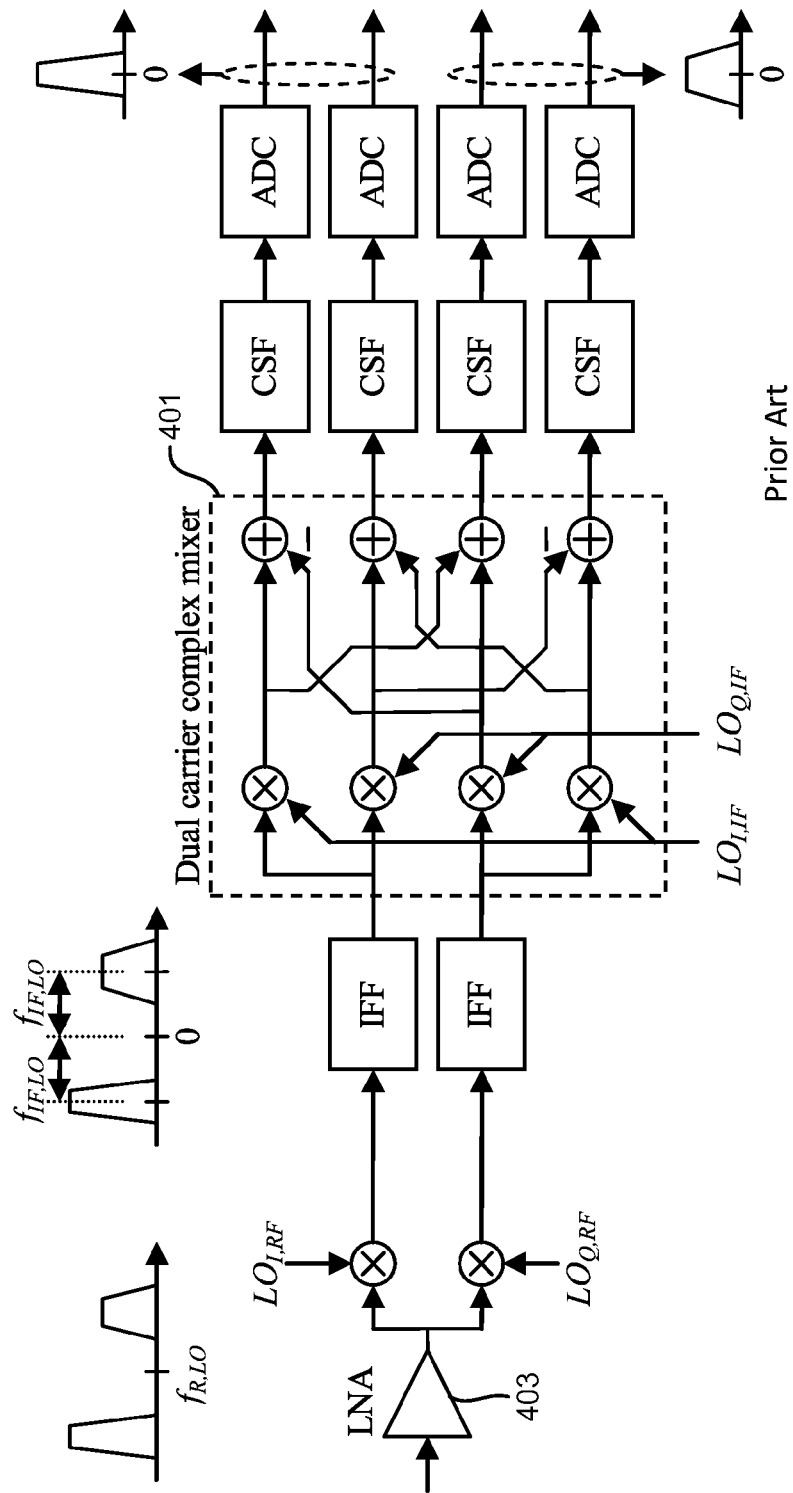
FIG. 4 shows the architecture of a complex intermediate frequency (IF) based receiver.
Figure 13:
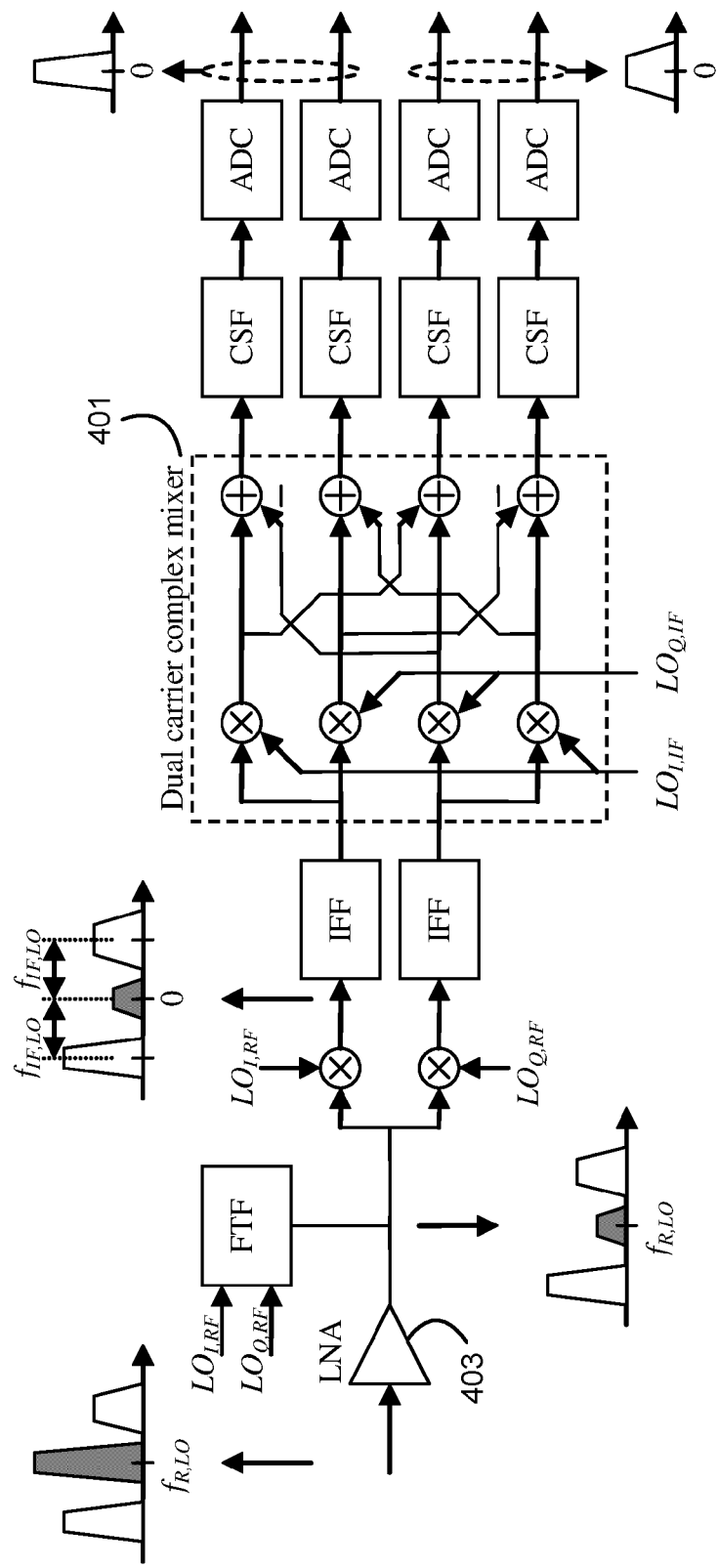
FIG. 13 shows an example of how a frequency translation filter according to an embodiment of the invention may be used with a complex intermediate frequency (IF) based receiver.
Figure 14:
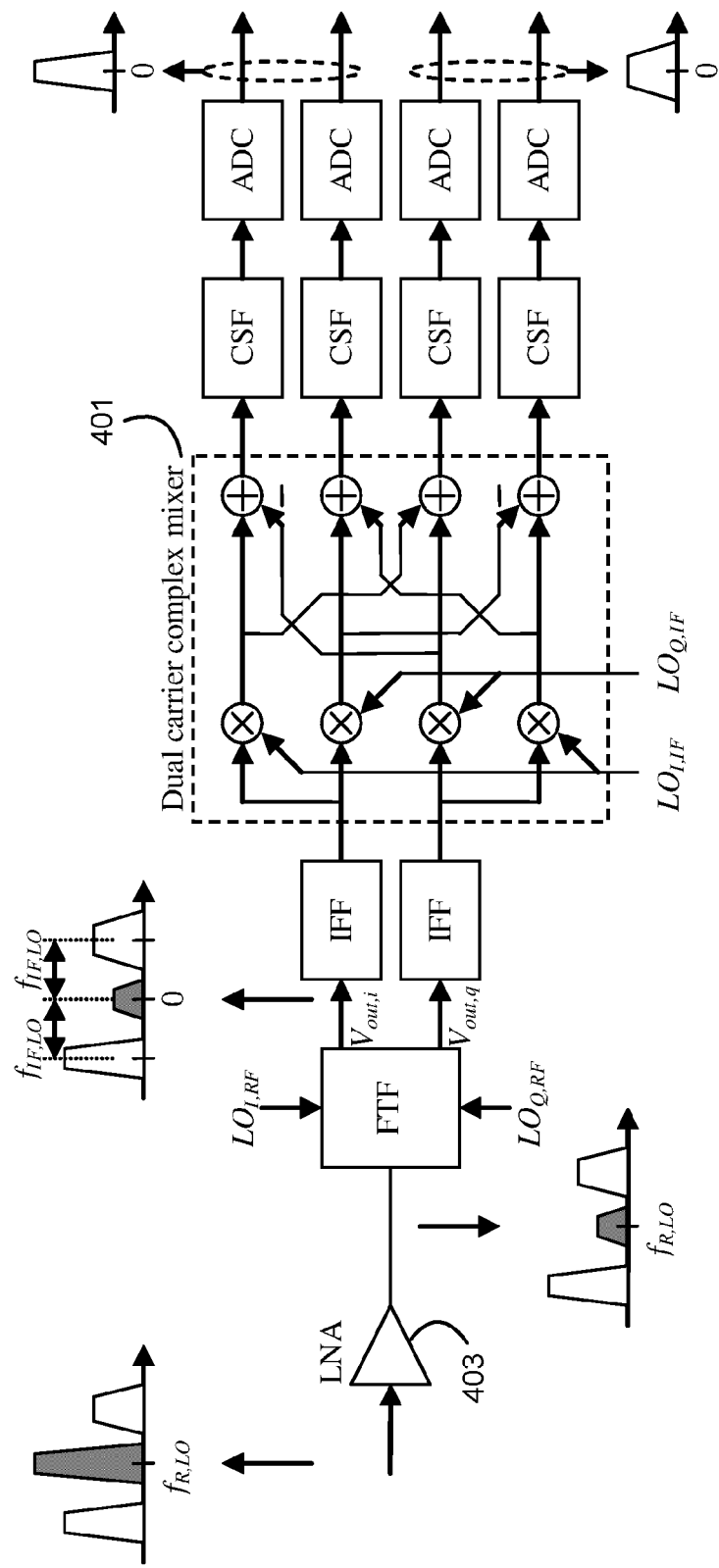
FIG. 14 shows another example of how a frequency translation filter according to an embodiment of the invention may be used with a complex intermediate frequency (IF) based receiver.

The embodiments above therefore provide a single RF front-end receiver for the reception of at least two non-contiguous carriers or two non-contiguous frequency ranges containing desired signals. The RF front-end down-converts the RF signal such that the two carriers or frequency ranges appear around the same IF frequency. The single RF front-end may be used with a complex IF architecture as described above in FIG. 4, although it is noted that the embodiments may also be used with other architectures. For example, the embodiments described above may be used as a load to a low noise amplifier LNA 403 in a complex IF architecture as shown in FIG. 4 (for example using the configuration shown in FIG. 3a), or as a combined mixer and filter at the output of the LNA 403 (i.e. in a combined unit as shown in FIG. 3b). Examples of such arrangements are shown in FIGS. 13 and 14, respectively.

Figure 15:
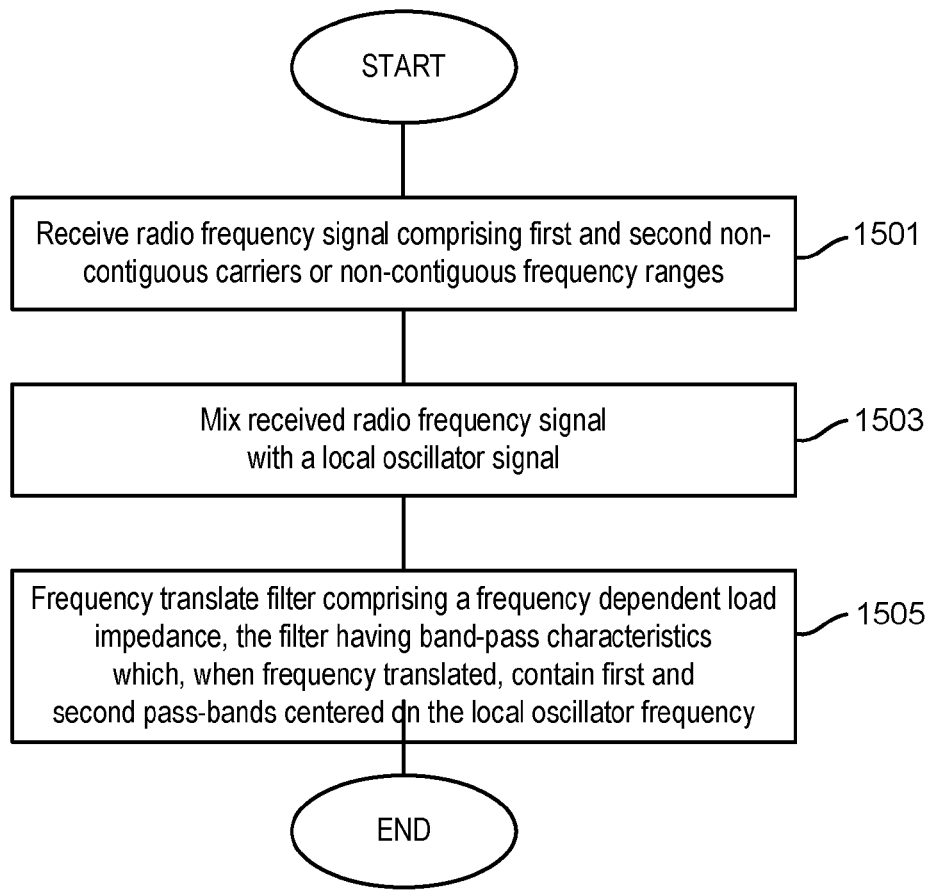
FIG. 15 shows the steps performed by a method according to an embodiment of the present invention.

FIG. 15 shows the steps performed by a frequency translation filter according to an embodiment of the invention. In step 1501 a radio frequency signal is received comprising first and second non-contiguous carriers or non-contiguous frequency ranges. The received radio frequency signal is mixed with a local oscillator signal, step 1503. A frequency translation filter is provided, step 1505, for frequency translating a filter comprising a frequency dependent load impedance, the filter having band-pass characteristics, which when frequency translated, contain first and second pass-bands centered on the local oscillator frequency. It is noted that a similar method may also be used with a composite filter.

The embodiment above has the advantage of providing a simplified frequency translation filter method for handling carrier aggregation.

A further advantage of the method described above is that if the local oscillator frequency changes, the two resonances will follow the local oscillator frequency by keeping their distance to the local oscillator frequency fixed. The embodiments of the invention enable a double response to be provided from a single complex impedance at the base band. The double response is provided simultaneously from the single complex impedance at the base band. This enables simultaneous reception of first and second carriers.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A frequency translation filter for handling carrier aggregation in a radio receiver, the frequency translation filter receiving a radio frequency signal comprising first and second non-contiguous carriers or first and second non-contiguous frequency ranges, the frequency translation filter comprising:
    a mixer configured to mix the radio frequency signal received on a first input with a local oscillator signal received on a second input and having a local oscillator frequency; and
    wherein the mixer includes a filter comprising a frequency dependent load impedance and having band-pass characteristics which, when frequency translated by the mixer, provide simultaneous first and second pass-bands corresponding to the first and second non-contiguous carriers or non-contiguous frequency ranges, wherein the first and second pass-bands are located about the local oscillator frequency.

2. The frequency translation filter as claimed in claim 1, wherein the frequency dependent load impedance comprises a second frequency translation filter, the second frequency translation filter using a second local oscillator frequency.

3. The frequency translation filter as claimed in claim 2, wherein the second frequency translation filter comprises a second frequency dependent load impedance, wherein the second frequency dependent load impedance comprises a third frequency translation filter, the third frequency translation filter using a third local oscillator frequency.

4. The frequency translation filter as claimed in claim 1, wherein the frequency dependent load impedance comprises an integrated component, a gyrator, a negative impedance converter, a frequency dependent negative resistor or a ladder architecture, or any two or more of such impedances.

5. The frequency translation filter as claimed in claim 1, wherein the local oscillator signal comprises an in-phase local oscillator signal and a quadrature local oscillator signal.

6. The frequency translation filter as claimed in claim 5, wherein the mixer includes:
    a first mixer configured to mix the in-phase local oscillator signal with the radio frequency signal; and
    a second mixer configured to mix the quadrature local oscillator signal with the radio frequency signal.

7. The frequency translation filter as claimed in claim 1, wherein the filter is tunable in order to configure the frequency translation filter to pass or stop, respectively, first and second non-contiguous carriers or non-contiguous frequency ranges of varying distance apart and/or varying bandwidth.

8. A radio frequency receiver configured to receive a radio frequency signal comprising first and second non-contiguous carriers or non-contiguous frequency ranges, the radio frequency receiver including a frequency translation filter comprising:
- a mixer configured to mix the radio frequency signal received on a first input with a local oscillator signal received on a second input and having a local oscillator frequency; and
- wherein the mixer includes a filter comprising a frequency dependent load impedance and having band-pass characteristics which, when frequency translated by the mixer, provide simultaneous first and second pass-bands corresponding to the first and second non-contiguous carriers or non-contiguous frequency ranges, wherein the first and second pass-bands are located about the local oscillator frequency.

9. The radio frequency receiver as claimed in claim 8, further comprising a low noise amplifier, wherein the frequency translation filter provides a load impedance for the low noise amplifier.

10. The radio frequency receiver as claimed in claim 8, wherein the frequency translation filter forms part of a down conversion unit.

11. A frequency translation filter for handling carrier aggregation in a radio receiver, the frequency translation filter configured to receive a radio frequency signal comprising first and second non-contiguous carriers or first and second non-contiguous frequency ranges, the frequency translation filter comprising:
- a mixer configured to mix the radio frequency signal received on a first input with a local oscillator signal having a local oscillator frequency and received on a second input; and
- wherein the mixer includes a composite band-pass or low-pass filter comprising a frequency dependent load impedance, the composite band-pass or low-pass filter comprising one or more stop-band or band-pass characteristics which, when frequency translated by the mixer, provide simultaneously one or more stop-bands for suppressing signals other than the desired first and second non-contiguous carriers or non-contiguous frequency ranges.

12. A method of obtaining first and second signals from a received radio frequency signal comprising aggregated first and second non-contiguous carriers or first and second non-contiguous frequency ranges, the method comprising:
- mixing the received radio frequency signal with a local oscillator signal in order to frequency translate a filter comprising a frequency dependent load impedance, the filter having band-pass characteristics which, when frequency translated by the mixing step, provide simultaneous first and second pass-bands corresponding to the first and second non-contiguous carriers or non-contiguous frequency ranges, and wherein the first and second pass-bands are located about the local oscillator frequency.

13. The method as claimed in claim 12, further comprising using a second frequency translation filter as the frequency dependent load impedance, the second frequency translation filter using a second local oscillator frequency.

14. The method as claimed in claim 13, wherein the second frequency translation filter comprises a second frequency dependent load impedance, and the method further comprises using a third frequency translation filter as the second frequency dependent load impedance, the third frequency translation filter using a third local oscillator frequency.

15. A method of obtaining first and second signals from a received radio frequency signal comprising aggregated first and second non-contiguous carriers or first and second non-contiguous frequency ranges, the method comprising:
- mixing the received radio frequency signal with a local oscillator signal in order to frequency translate a composite filter comprising a frequency dependent load impedance, the composite filter configured to comprise one or more band-stop or band-pass characteristics which, when frequency translated by the mixing step, provide simultaneous one or more stop-bands for suppressing signals other than the desired first and second non-contiguous carriers or non-contiguous frequency ranges.

* * * * *